United States Patent [19]
Nakamura et al.

[11] Patent Number: 5,434,127
[45] Date of Patent: Jul. 18, 1995

[54] METHOD FOR MANUFACTURING SUPERCONDUCTING DEVICE HAVING A REDUCED THICKNESS OF OXIDE SUPERCONDUCTING LAYER

[75] Inventors: Takao Nakamura; Hiroshi Inada; Michitomo Iiyama, all of Osaka, Japan

[73] Assignee: Sumitomo Electric Industries, ltd., Japan

[21] Appl. No.: 280,123

[22] Filed: Jul. 25, 1994

Related U.S. Application Data

[62] Division of Ser. No. 766,184, Sep. 27, 1991, Pat. No. 5,407,903.

[30] Foreign Application Priority Data

Sep. 28, 1990 [JP] Japan ................... 2-259157
Sep. 28, 1990 [JP] Japan ................... 2-259160

[51] Int. Cl.⁶ ............................. H01L 39/24
[52] U.S. Cl. ..................... 505/330; 505/410; 505/473; 505/475; 505/193; 505/191; 505/728; 427/62; 427/63; 257/66
[58] Field of Search ............... 505/330, 410, 473, 475, 505/193, 191, 728; 427/62, 63; 257/66

[56] References Cited

U.S. PATENT DOCUMENTS 5,126,315  6/1992  Nishino et al. .
5,236,896  8/1993  Nakamura et al. ............... 505/193
5,274,249 12/1993  Xi et al. ............... 505/193

FOREIGN PATENT DOCUMENTS 1-101676  4/1989  Japan .
1-170080  7/1989  Japan .
1-239886  9/1989  Japan .

OTHER PUBLICATIONS

Wu et al., "High Critical Currents in Epitaxial Y-Ba-Cu-O Thin Films On Silicon With Buffer Layers," Appl. Phys. Lett., vol. 54, #8, 20 Feb. 1989, pp. 754–756.

Mizuno et al., "Fabrication Of Thin-Film-Type Josephson Junctions Using A Bi-Sr-Ca-Cu-O/Bi-Sr-Cu-O/Bi-Sr-Ca-Cu-O Structure," Appl. Phys. lett., vol. 56, #15, 9 Apr. 1990, ppo. 1469–1471.

*Primary Examiner*—Roy V. King
*Attorney, Agent, or Firm*—Beveridge, DeGrandi, Weilacher & Young

[57] ABSTRACT

For manufacturing a superconducting device, a first c-axis orientated oxide superconductor thin film having a very thin thickness is formed on a principal surface of a substrate, and a stacked structure of a gate insulator and a gate electrode is formed on a portion of the first oxide superconductor thin film. An a-axis orientated oxide superconductor thin film is grown, using the gate electrode as a mask, so that second and third superconducting regions having a relatively thick thickness are formed at both sides of the gate electrode, electrically isolated from the gate electrode. The superconducting device thus formed can functions as a super-FET.

17 Claims, 5 Drawing Sheets

METHOD FOR MANUFACTURING SUPERCONDUCTING DEVICE HAVING A REDUCED THICKNESS OF OXIDE SUPERCONDUCTING LAYER

This is a divisional of application Ser. No. 07/766,184 filed on Sep. 27, 1991, now U.S. Pat. No. 5,407,903.

BACKGROUND OF THE INVENTION

1. Field of the Invention

The present invention relates to a method for manufacturing a superconducting device, and more specifically to a method for manufacturing a superconducting device including an oxide superconducting layer having a partially reduced thickness portion forming a superconducting channel controlled by a gate electrode, and a superconducting device manufactured by the method.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of 5 nanometers.

SUMMARY OF THE INVENTION

Accordingly, it is an object of the present invention to provide a method for manufacturing a superconducting device, which have overcome the above mentioned defects of the conventional ones.

Another object of the present invention is to provide a method for manufacturing an FET type superconducting device including an oxide superconducting layer having an extremely thin portion forming a superconducting channel, with a good repeatability by using existing established processing techniques.

Still another object of the present invention is to provide an FET type superconducting device having a unique structure which have overcome the above mentioned defects of the conventional ones.

The above and other objects of the present invention are achieved in accordance with the present invention by a method for manufacturing a superconducting device, the method comprising the step of preparing a substrate having a principal surface thereof, forming a c-axis orientated oxide superconductor thin film having a very thin thickness on the principal surface of the substrate, forming on a portion of the c-axis orientated oxide superconductor thin film a stacked structure including a gate insulator formed directly on the c-axis orientated oxide superconductor thin film and a gate electrode formed on the gate insulator, growing an a-axis orientated oxide superconductor thin film, using the gate electrode as a mask, so that superconducting regions having a relatively thick thickness are formed of a-axis orientated oxide superconductor thin films at both sides of the gate electrode, electrically isolated from the gate electrode, and forming a superconducting source region and a superconducting drain region, respectively.

According to another aspect of the present invention, there is provided a superconducting device which comprises a substrate having a principal surface, a first oxide superconducting region of an extremely thin thickness formed on the principal surface of the substrate, second and third oxide superconducting regions of a relatively thick thickness formed near each end of the first oxide superconducting region separated from each other, the first oxide superconducting region being electrically connected to the second and third oxide superconducting regions to bridge the second and third oxide superconducting regions and to form a superconducting channel between the second and third oxide superconducting regions, so that a superconducting current can flow through the superconducting channel between the second and third oxide superconducting regions, and a gate electrode formed on a gate insulator placed on the first oxide superconducting region for controlling the superconducting current flowing through the superconducting channel, the first oxide superconducting regions being formed of a c-axis orientated oxide superconductor thin film, the second and third oxide superconducting regions being formed of a-axis orientated oxide superconductor thin films and the gate electrode being electrically isolated from the first, second and third oxide superconducting regions.

In a preferred embodiment, the oxide superconductor thin film is formed of a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate, on which the oxide superconductor thin film is deposited, can be formed of an insulating substrate, preferably an oxide single crystalline substrate such as MgO, SrTiO$_3$, CdNdAlO$_4$, etc. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a MgAlO$_4$ layer and a BaTiO$_3$ layer if silicon is used as a substrate.

In the superconducting device manufactured in accordance with the present invention, the superconducting current flowing between the second and third oxide superconducting regions through the superconducting channel formed of the first oxide superconducting region is controlled by a voltage applied to the gate electrode. Namely, the superconducting device constitutes the super-FET. In order to ensure that the superconducting channel can be turned on and off by a voltage applied to the gate electrode, a thickness of the superconducting channel has to be on the order of 5 nanometers in the direction of an electric field created by the voltage applied to the gate electrode. This extremely thin superconducting channel can be easily realized or formed in accordance with the method of the present invention.

For example, the c-axis orientated oxide superconductor thin film is formed to have the thickness on the order of about 5 nanometers. This extremely thin oxide superconductor thin film can be formed in a conventional process by precisely controlling both of the thin film growth speed and the growth time. For this purpose, a sputtering can be used. However, since the oxide superconductor crystal has a multi-layer structure in which respective constituent elements are stacked in a layered structure, it is possible to stack a desired number of unit cells of oxide superconductor, by using a MBE (molecular beam epitaxy).

In another preferred embodiment, the c-axis orientated oxide superconductor thin film is formed to have the thickness on the order of about 20 nanometers. An upper portion of the c-axis orientated oxide superconductor thin film having a thickness of more than 10 nanometers is changed into an oxide insulating layer so that a lower portion of the c-axis orientated oxide superconductor thin film becomes a superconducting channel having a thickness of about 5 nanometers. To change the upper portion of the c-axis orientated oxide superconductor thin film to the oxide insulating layer, the c-axis orientated oxide superconductor thin film is heated under high vacuum.

Oxygens of crystals of an oxide superconductor escapes when the oxide superconductor is heated under vacuum. Superconducting properties of an oxide superconductor is sensitive to amounts of oxygen which is included in the crystals of the oxide superconductor. If the crystals of the oxide superconductor lack oxygen, the critical temperature of the oxide superconductor lowers considerably or the oxide superconductor loses its superconductivity.

Therefore, the upper portion of the c-axis orientated oxide superconductor thin film is changed into an oxide insulating layer substantially and the extremely thin oxide superconductor thin film can be formed. The thickness of the oxide insulating layer is controlled by the heat process time. It is preferable to etch the oxide superconductor film so that side surfaces of a portion which will be changed into the oxide insulating layer, which are parallel to the c-axis of crystals of oxide superconductor, are exposed, since the oxygen of crystals of oxide superconductor migrates to a direction perpendicular to the c-axis of crystals of oxide superconductor easier.

The extremely thin c-axis orientated oxide superconductor thin film thus foraged or deposited is very preferable in thickness and the crystal orientation to form a superconducting channel, but insufficient in thickness and inadequate in the crystal orientation to form a superconducting source region and a superconducting drain region. Therefore, the superconducting layer in the superconducting source region and the superconducting drain region must be further thickened and formed of an a-axis orientated oxide superconductor thin film. The above mentioned method in accordance with the present invention is very effective in forming the superconducting source region and the superconducting drain region of an a-axis orientated oxide superconductor thin film having enough thickness while maintaining the thickness of the extremely thin oxide superconductor thin film constituting the superconducting channel.

Namely, in one preferred embodiment, a gate electrode is formed on the extremely thin c-axis orientated oxide superconductor thin film at a position corresponding to the superconducting channel, and the c-axis orientated oxide superconductor thin film is selectively etched and removed excluding the superconducting channel so that a portion of the substrate is exposed and the a-axis orientated oxide superconductor thin film is deposited or grown on the exposed substrate, using the gate electrode as a mask.

It is preferable that normal conductor members which are formed of a metal stable to the oxide superconductor such as Au, Pt are arranged between the superconducting channel and the superconducting source region and between the superconducting channel and the superconducting drain region. These normal conductor members prevent oxygen of the superconducting channel from escaping while the superconducting source region and the superconducting drain region are formed, and prevent the c-axis orientated oxide superconductor thin film from interfering the a-axis orientated oxide superconductor thin films. Therefore, the c-axis orientated oxide superconductor thin film and the a-axis orientated oxide superconductor thin films have high degree of crystallinity and orientation. The normal conductor members have thickness which may not disturb the superconducting current flow by penetrating between the superconducting channel and superconducting source region and between the superconducting channel and superconducting drain region.

In another preferred embodiment, a gate electrode is formed on the rather thin c-axis orientated oxide superconductor thin film at a position corresponding to the superconducting channel, and at the same time, the c-axis orientated oxide superconductor thin film is selectively etched so that the portion under the gate electrode projects from an etched portion and the a-axis orientated oxide superconductor thin film is deposited or grown on an etched surface of the c-axis orientated oxide superconductor thin film.

In one preferred embodiment, both side surfaces of the gate electrode are covered with insulating sidewalls, and the second deposition or growth of the a-axis orientated oxide superconductor thin film is performed until the gate electrode is completely embedded in the a-axis orientated oxide superconductor thin film, and thereafter, the a-axis orientated oxide superconductor thin film is planarized until an upper surface of the gate electrode is exposed at the planarized upper surface of the a-axis orientated oxide superconductor thin film. In this process, although the gate electrode is embedded in the a-axis orientated oxide superconductor thin film, the gate electrode is electrically isolated from the oxide superconductor thin film by the gate insulator and the side insulating layer.

As seen from the above, the method in accordance with the present invention includes no process which requires high-precision for forming the superconducting channel. Therefore, the limitation in the fine processing techniques required for manufacturing the super-FET can be relaxed.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1I, the process in accordance with the present invention for manufacturing the super-FET will be described.

Figure 1A:
FIGS. 1A, 1B, 1C, 1D, 1E, 1F, 1G, 1H and 1I are diagrammatic sectional views for illustrating a first embodiment of the method in accordance with the present invention for manufacturing the superconducting device.

As shown in FIG. 1A, a substrate 5 having a substantially planar principal surface is prepared. This substrate 5 is formed of for example, an insulator substrate such as a MgO (100) substrate, a $SrTiO_3$ (100) substrate, a $CdNdAlO_4$ (001) substrate or others, or a semiconductor substrate such as a silicon substrate having a principal surface coated with a buffer layer composed of an insulating film. In the case of the silicon substrate, the principal surface of the silicon is preferably coated with $MgAlO_4$ by a CVD (chemical vapor deposition) and also with $BaTiO_3$ by a sequential sputtering process.

Figure 1B:
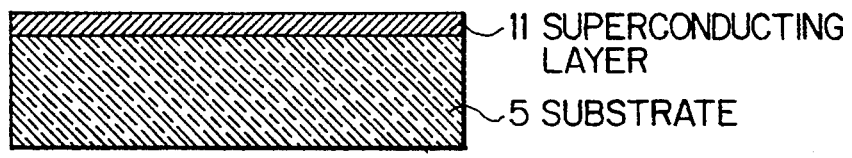

As shown in FIG. 1B, an extremely thin c-axis orientated $Y_1Ba_2Cu_3O_{7-\delta}$ oxide superconductor thin film 11 having a thickness on the order of about 5 nanometers is deposited on the principal surface of the substrate 5, by for example an off-axis sputtering, a reactive evaporation, an MBE (molecular beam epitaxy), a CVD, etc. This extremely thin oxide superconductor thin film 11 forms a superconducting channel 10 when the super-FET is completed. The superconducting channel is preferably formed of c-axis orientated thin film, since the c-axis orientated thin film has a large critical current density in the direction in parallel to the substrate surface. A condition of forming the c-axis orientated $Y_1Ba_2Cu_3O_{7-\delta}$ oxide superconductor thin film 11 by off-axis sputtering is as follows:

| Sputtering Gas | |
|---|---|
| Ar: | 90% |
| $O_2$: | 10% |
| Pressure | 10 Pa |
| Temperature of the substrate | 700° C. |

The oxide superconductor thin film is preferably formed of, for example, a Bi—Sr—Ca—Cu—O type compound oxide superconductor material, or a Tl—Ba—Ca—Cu—O type compound oxide superconductor material other than Y—Ba—Cu—O type compound oxide superconductor material.

Figure 1C:
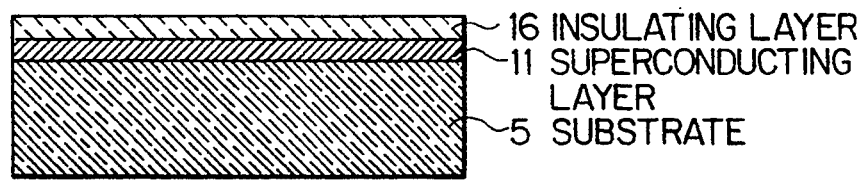

Then, as shown in FIG. 1C, an insulating layer 16 is deposited on the oxide superconductor thin film 11. The insulating layer 16 is deposited to have a thickness of not less than 10 nanometers which is sufficient to prevent a tunnel current. In addition, the insulating layer 16 is foraged of an insulating material such as MgO, which does not form a large density of energy levels between the superconductor thin film 11 and the insulating layer 16. Furthermore, from the viewpoint of a mechanical stress, it is preferred to form on the oxide superconductor thin film 11 an insulating layer having a composition similar or analogous to that of the oxide superconductor thin film 11, without taking out the substrate 5 from a film deposition apparatus or chamber after the oxide superconductor thin film 11 is deposited on the substrate 5.

Figure 1D:
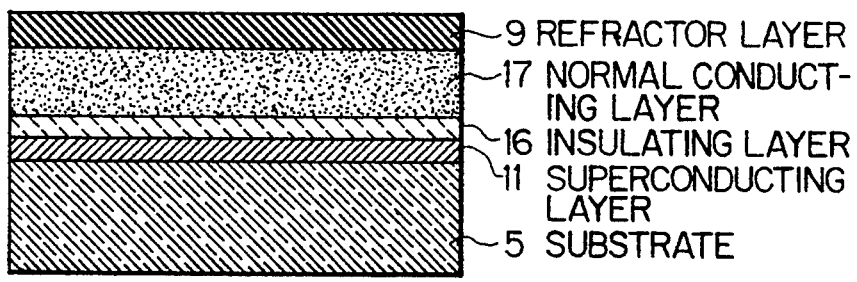

Thereafter, as shown in FIG. 1D, a normal conducting layer 17 is deposited on the insulating layer 16 and a refractory layer 9 is deposited on the normal conducting layer 17. The normal conducting layer 17 can be deposited by a vacuum evaporation or any other suitable process, so as to have a thickness of about 200 nanometers. The normal conducting layer 17 can be formed of Au, or a refractory metal such as Ti, W or a silicide thereof.

The insulating layer 16 and the normal conducting layer 17 are preferably deposited continuously on the oxide superconductor thin film 11, without taking out the substrate 5 from a film deposition apparatus or chamber.

The refractory layer 9 is formed of a refractory metal such as Mo etc., a refractory resist, an insulating layer and can be deposited by a vacuum evaporation etc.

Figure 1E:
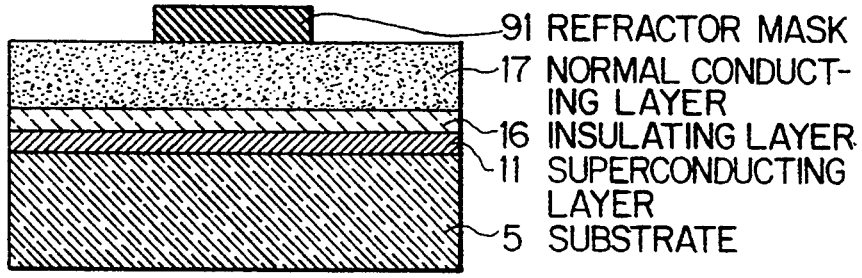

The refractory layer 9 is selectively etched so as to remove all of the refractory layer excluding a portion 91 which is above the super conducting channel and to form a gate electrode pattern, as shown in FIG. 1E.

Figure 1F:
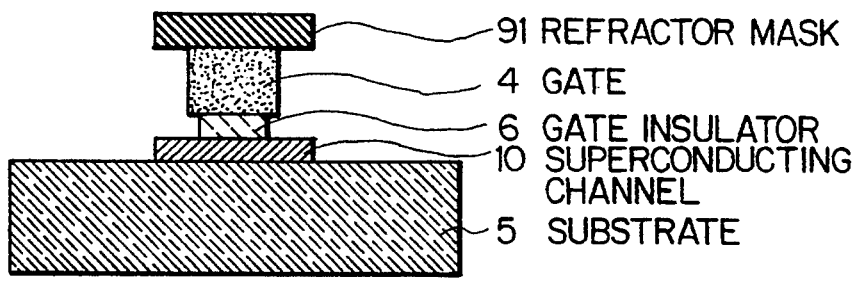

Thereafter, as shown in FIG. 1F, the stacked layer of the oxide superconductor thin film 11, the insulating layer 16 and the normal conducting layer 17 is selectively removed so as to form a superconducting channel 10, a gate insulator 6 and a gate electrode 4. For this purpose, the normal conducting layer 17, the insulating layer 16 and the oxide superconductor thin film 11 are selectively etched in a self alignment to the patterned refractory mask 91, so as to remove all of the metal layer excluding a portion which becomes the gate electrode on the superconducting channel 10, so that the gate electrode 4 is formed, and a gate insulator 6 is left on the oxide superconductor thin film 11 and only under the patterned gate electrode 4, and a superconducting channel 10 is left on the substrate 5, and the substrate 5 is exposed excluding a portion under the superconducting channel 10. In this connection, it is desired that the gate electrode 4 and the gate insulator 6 are side-etched in comparison with the superconducting channel 10, so that the gate electrode 4 has a length shorter than that of the superconducting channel 10 and the gate insulator 6 has a length shorter than that of the gate electrode 4.

Figure 1G:
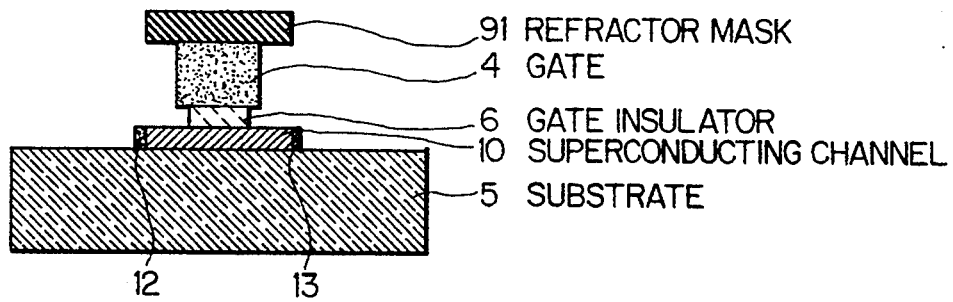

Thereafter, as shown in FIG. 1G, normal conductor members 12 and 13 are formed on the both ends of the superconducting channel 10. These normal conductor members 12 and 13 can be formed by depositing an Au layer covering the superconducting channel 10 and exposing portion of the substrate 5, and etching back the deposited Au layer by means of an anisotropic etching so that the Au layer remains only on the side surfaces of the superconducting channel 10.

Figure 1H:
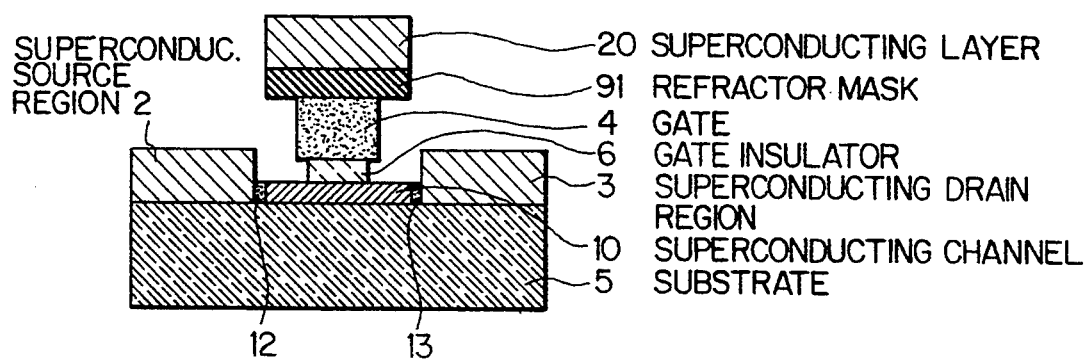

Then, as shown in FIG. 1H, a superconducting source region 2 and a superconducting drain region 3 of an a-axis orientated $Y_1Ba_2Cu_3O_{7-\delta}$ oxide superconductor thin film are formed on the substrate 5 at both sides of the superconducting channel 10, respectively. An a-axis orientated $Y_1Ba_2Cu_3O_{7-\delta}$ oxide superconductor thin film can be formed by an off-axis sputtering process which is carried out under a condition that the substrate temperature is not higher than 650° C. A sputtering condition under which the superconducting source region 2 and the superconducting drain region 3 are formed is as follows:

Sputtering Gas

-continued

| Ar: | 90% |
| O2: | 10% |
| Pressure | 10 Pa |
| Temperature of the substrate | 640° C. |

Figure 1I:
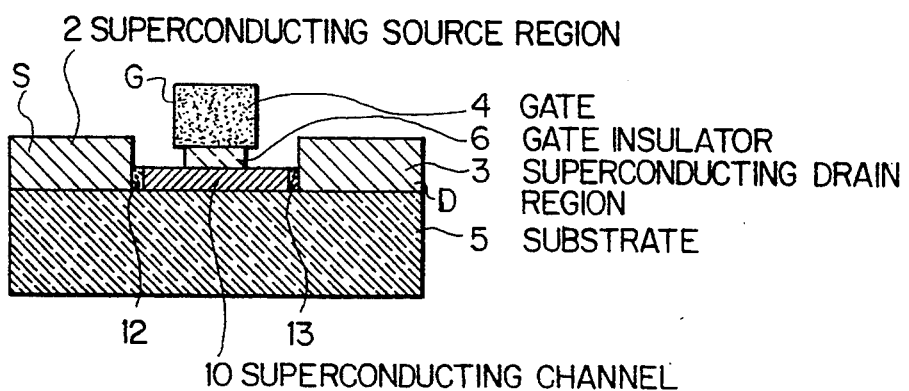

At the same time, an a-axis orientated oxide superconductor thin film 20 is deposited on the refractory mask 91, however, the refractory mask 91 which is formed of Mo sublimates while the oxide superconductor thin film is deposited. With this, the super-FET in accordance with the present invention is completed, as shown in FIG. 1I. The oxide superconductor thin film 20 can be left above the gate electrode 4, in the case of using an insulator as the refractory mask 91.

As explained above, if the super-FET is manufactured in accordance with the first embodiment of the method of the present invention, the limitation in the fine processing technique required for manufacturing the super-FET is relaxed. Since the flatness of the upper surface of the superconducting device can be improved, it become easy to form conductor wirings in a later process. Accordingly, it is easy to manufacture the super-FET with good repeatability, and the manufactured super-FET has a stable performance.

Referring to FIGS. 2A to 2G, a second embodiment of the process for manufacturing the superconducting device will be described.

Figure 2A:
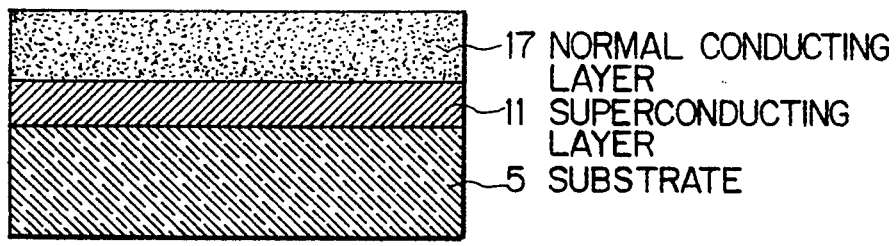
FIGS. 2A, 2B, 2C, 2D, 2E and 2F are diagrammatic sectional views for illustrating featured steps of a second embodiment of the method in accordance with the present invention for manufacturing the superconducting device.

In this second embodiment, the same processings as those shown in FIGS. 1A to 1B are performed except that the c-axis oxide superconductor thin film 11 is formed having a thickness on the order of 20 nanometers. After the c-axis orientated oxide superconductor thin film 11 is deposited, as shown in FIG. 2A, a normal conducting layer 17 is deposited on the oxide superconductor thin film 11 by a CVD, a sputtering, etc. The normal conducting layer 17 can be formed of Au, or a refractory metal such as Ti, W or a silicide thereof.

Figure 2B:
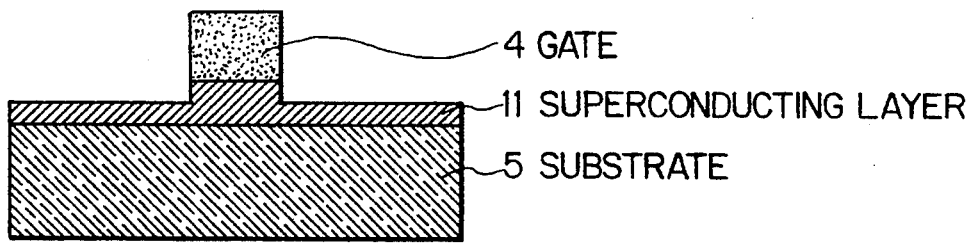

As shown in FIG. 2B, the normal conducting layer 17 is selectively etched so as to remove all of the normal conducting layer excluding a portion which becomes the gate electrode on the superconducting channel 10, so that the gate electrode 4 is formed. Then, the oxide superconductor thin film 11 is selectively etched more than 10 nanometers in a self alignment to the patterned gate electrode 4, so that a portion under the patterned gate electrode 4 projects from the etched portion of the oxide superconductor thin film 11.

Figure 2C:
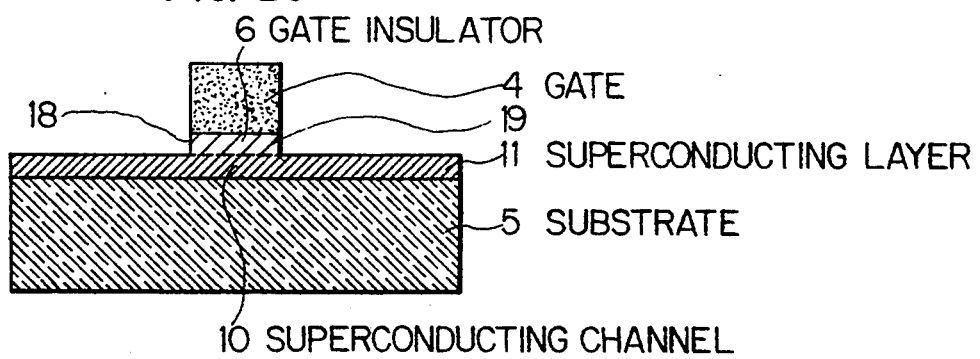

Thereafter, the substrate 5 is heated to more than 400° C. under a pressure of $10^{-5}$ Pa. Then, as shown in FIG. 2C, oxygen of the crystals of the portion of the oxide superconductor thin film 11 under the patterned gate electrode 4 escapes through side surfaces 18 and 19 so that the portion changes to the gate insulator 6. The portion of the oxide superconductor thin film 11 under the gate insulator 6 becomes superconducting channel 10.

An oxide superconductor loses its superconductivity when it lacks oxygen of its crystals. Therefore, after the process, the oxide which forms gate insulator 6 becomes an oxide insulator for lack of oxygen. In above process the oxygen of the crystals of the oxide superconductor escapes only through sides 18 and 19, since the oxide superconductor has larger diffusion coefficients of oxygen along the a-axis and the b-axis of the crystal than along the c-axis.

Figure 2D:
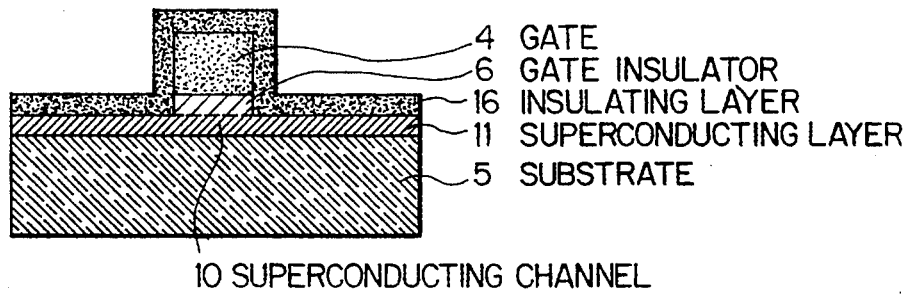
Figure 2E:
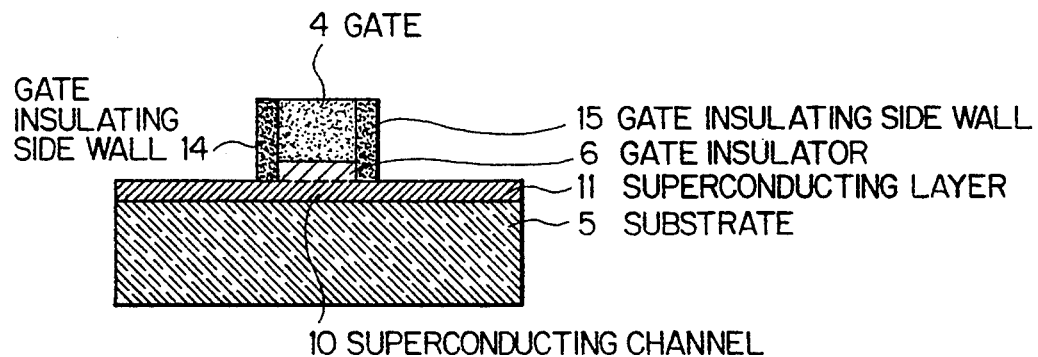

After the process, as shown in FIG. 2D, an insulating layer 16 which covers the extremely thin oxide superconductor thin film 11 and the gate electrode 4 is deposited. The insulating layer 16 is formed of an insulating material such as MgO by a sputtering etc. Then as shown in FIG. 2E, the insulating layer 16 is etched by an anisotropic etching so that the insulating layer remains only on the side surfaces of the gate electrode 4 to form the gate insulating side-walls 14 and 15.

Figure 2F:
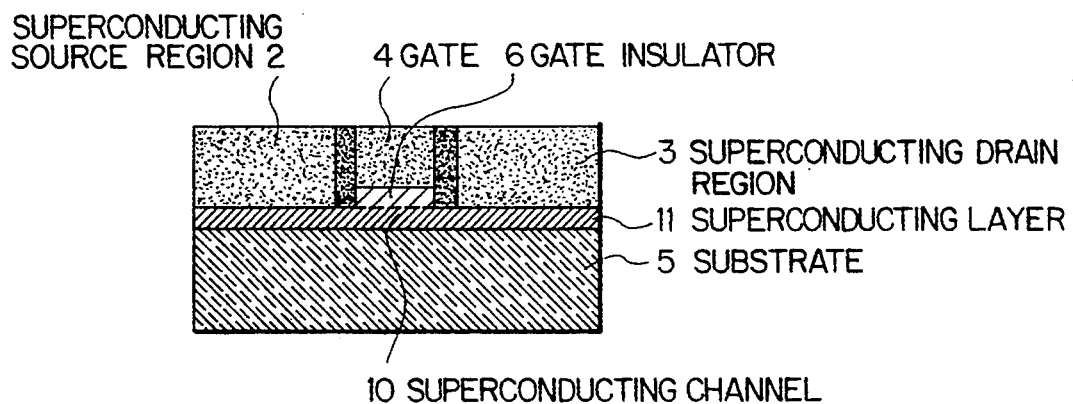

Finally, as shown in FIG. 2F, a superconducting source region 2 and a superconducting drain region 3 of an a-axis orientated oxide superconductor thin film are formed on the oxide superconductor thin film 11 at both sides of the gate electrode 4 and of gate insulator 6, respectively. In the process, in order to planarize an upper surface of the deposited a-axis orientated oxide superconductor thin film and to shape the superconducting source region 2 and the superconducting drain region 3, a photoresist layer (not shown) is deposited on the a-axis orientated oxide superconductor thin film in such a manner that the deposited photoresist layer has a flat upper surface, and then, the deposited photoresist layer and the deposited a-axis orientated oxide superconductor thin film are etched back, until the upper surface of the a-axis orientated oxide superconductor thin film is planarized and the gate electrode 4 is exposed at the planarized upper surface of the a-axis orientated oxide superconductor thin film as shown in FIG. 2F. With this, the super-FET in accordance with the present invention is completed.

As explained above, if the super-FET is manufactured in accordance with the second embodiment of the method of the present invention, the limitation in the fine processing technique required for manufacturing the super-FET is relaxed, similarly to the first embodiment. In addition, since the upper surface of the superconductor thin film is planarized, it become easy to form conductor wirings in a later process. Accordingly, it is easy to manufacture the super-FET with good repeatability, and the manufactured super-FET has a stable performance.

The super-FET manufactured in accordance with the method of the present invention comprises the superconducting channel 10 formed on the substrate 5 and the gate electrode 4 arranged on the superconducting channel 10. The superconducting channel 10 is formed of a c-axis orientated oxide superconductor thin film which is as extremely thin as about 5 nanometers. Both sides of the superconducting channel 10, the superconducting source region 2 and the superconducting drain region 3 are located, respectively. The superconducting source region 2 and the superconducting drain region 3 are formed of a-axis orientated oxide superconductor thin films, which are directly formed on the substrate 5 in the embodiment shown in FIG. 1I or formed on the c-axis orientated super conductor thin film 11 in the embodiment shown in FIG. 2F. On the other hand, the gate electrode 4 is located on the gate insulator 6 foraged directly on the superconducting channel 10.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing a superconducting device comprising:

preparing a substrate having a principal surface thereof;

forming a c-axis orientated oxide superconductor thin film on the principal surface of the substrate;

forming a stacked structure over a portion of the c-axis orientated oxide superconductor thin film, the stacked structure including
a gate insulator formed directly on the c-axis orientated oxide superconductor thin film and
a gate electrode formed on the gate insulator; and forming a superconducting source region and a superconducting drain region of a-axis orientated oxide superconductor thin films at sides of the gate electrode such that the superconducting source region and the superconducting drain region are electrically isolated from the gate electrode.

2. A method according to claim 1 wherein the c-axis orientated oxide superconductor thin film and the a-axis orientated oxide superconductor thin films are formed of the same oxide superconductor material selected from the group consisting of Y—Ba—Cu—O based compound oxide superconductor materials, Bi—Sr—Ca—Cu—O based compound oxide superconductor materials, and Tl—Ba—Ca—Cu—O based compound oxide superconductor materials.

3. A method according to claim 2 wherein the stacked structure includes a layer of a refractory metal or a silicide thereof.

4. A method according to claim 2 wherein the gate electrode is formed of a material selected from the group consisting of Au, Ti, W, and silicides thereof.

5. A method according to claim 2 wherein the substrate is formed of a material selected from the group consisting of a MgO (100) substrate, a SrTiO$_3$ (100) substrate, a CdNdAlO$_4$ (001) substrate, and a semiconductor substrate.

6. A method according to claim 2 wherein the substrate is a silicon substrate having the principal surface coated with an insulating material layer formed of a MgAlO$_4$ layer and a BaTiO$_3$ layer.

7. A method according to claim 2 further including the step of selectively etching the c-axis orientated oxide superconductor thin film to remove the c-axis orientated oxide superconductor thin film except for the portion of the c-axis orientated oxide superconductor thin film under the stacked structure to expose a portion of the principal surface of the substrate, wherein the a-axis orientated oxide superconductor thin films are grown on the exposed portion of the principal surface of the substrate.

8. A method according to claim 7 wherein the c-axis orientated oxide superconductor thin film is formed to have a thickness of about 5 nanometers and the gate insulator is formed of MgO to have a thickness of not less than 10 nanometers.

9. A method according to claim 2, wherein the stacked structure is formed by forming an insulating layer on the c-axis orientated oxide superconductor thin film;

forming a normally conductive material layer on the insulating layer;

etching the normally conductive material layer to form the gate electrode; and etching the insulating layer to form the gate insulator.

10. A method according to claim 9, wherein the formation of the stacked structure further includes forming a refractory material layer on the normally conductive material layer, and etching the refractory material layer to form a mask of refractory material.

11. A method according to claim 9, wherein the normally conductive material layer and the insulating layer are etched so that the gate electrode is wider than the gate insulator.

12. A method according to claim 2, wherein the stacked structure is formed by
forming a normally conductive material layer on the c-axis orientated oxide superconductor thin film;
etching the normally conductive material layer and the c-axis orientated oxide superconductor thin film to form a gate electrode on a projection from the c-axis orientated oxide superconductor thin film; and
heating the projection under a high vacuum so as to cause oxygen in oxide superconductor crystals of the projection to escape, thereby causing the projection to form a gate insulator.

13. A method according to claim 7, wherein the a-axis orientated oxide superconductor thin film is separated from the c-axis orientated oxide superconductor thin film by normally conductive material.

14. A method according to claim 7, wherein the a-axis orientated oxide superconductor thin film is grown on the exposed portion of the principal surface of the substrate using the stacked structure as a mask.

15. A method according to claim 2, further including the step of forming gate insulating side walls on sides of the gate electrode, such that the superconducting source region and the superconducting drain region are electrically separated from the gate electrode by the gate insulating side walls.

16. A method according to claim 15, wherein the a-axis orientated oxide superconductor thin films are formed on the c-axis orientated oxide superconductor thin film.

17. A method according to claim 12 wherein the c-axis orientated oxide superconductor thin film is formed to have an initial thickness of about 20 nanometers and the gate insulator is formed to have a thickness of not less than 10 nanometers.

* * * * *